United States Patent
Yoshida et al.

(10) Patent No.: US 12,224,158 B2
(45) Date of Patent: Feb. 11, 2025

(54) PLASMA PROCESSING APPARATUS

(71) Applicant: HITACHI HIGH-TECH CORPORATION, Tokyo (JP)

(72) Inventors: Yoshinori Yoshida, Tokyo (JP); Yutaka Kouzuma, Tokyo (JP); Kazuyuki Hirozane, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 18/026,434

(22) PCT Filed: Mar. 9, 2022

(86) PCT No.: PCT/JP2022/010303
§ 371 (c)(1),
(2) Date: Mar. 15, 2023

(87) PCT Pub. No.: WO2023/170822
PCT Pub. Date: Sep. 14, 2023

(65) Prior Publication Data
US 2024/0297021 A1 Sep. 5, 2024

(51) Int. Cl.
*H01J 37/32* (2006.01)
(52) U.S. Cl.
CPC .. *H01J 37/32449* (2013.01); *H01J 37/32522* (2013.01); *H01J 37/32834* (2013.01); *H01J 2237/3344* (2013.01)
(58) Field of Classification Search
CPC ............ H01J 37/3244; H01J 37/32449; H01J 37/32522; H01J 37/32834; H01J 2237/3344; C23C 16/4557
See application file for complete search history.

(56) References Cited

U.S. PATENT DOCUMENTS

| | | | |
|---|---|---|---|
| 2004/0052693 A1* | 3/2004 | Crane, Jr. .............. | B01D 53/92 422/171 |
| 2006/0076060 A1 | 4/2006 | Ohmi et al. | |

(Continued)

FOREIGN PATENT DOCUMENTS

| | | |
|---|---|---|
| JP | 2004-264881 A | 9/2004 |
| JP | 2007-317696 A | 12/2007 |

(Continued)

OTHER PUBLICATIONS

Search Report mailed May 17, 2022 in International Application No. PCT/JP2022/010303.

(Continued)

*Primary Examiner* — Jimmy T Vu
(74) *Attorney, Agent, or Firm* — Miles & Stockbridge, P.C.

(57) ABSTRACT

A plasma processing apparatus that can inhibit clustering of gas and supply the gas stably, including an integrated gas box configured to adjust the flow rate of gas, and a discharge portion, and the integrated gas box includes gas blocks including a flow path through which the gas flows, a heater configured to heat the flow path, a bypass path provided in the flow path, and a flow controller configured to detect the inflow amount of the gas and output the gas from the flow path to the discharge portion. The heater is configured to perform heating to a predetermined temperature based on the type of the gas. The predetermined temperature is, for example, 65° C. or more. The bypass path includes a flow path causing a change in the pressure of the gas flowing through the flow path.

10 Claims, 8 Drawing Sheets

(56) References Cited

U.S. PATENT DOCUMENTS

2010/0037959 A1    2/2010  Kamaishi et al.
2016/0020115 A1    1/2016  Demichi et al.

FOREIGN PATENT DOCUMENTS

| JP | 2008-014390 A | 1/2008 |
| --- | --- | --- |
| JP | 2008-146641 A | 6/2008 |
| JP | 2013-211406 A | 10/2013 |
| JP | 2016-025195 A | 2/2016 |

OTHER PUBLICATIONS

Written Opinion mailed May 17, 2022 in International Application No. PCT/JP2022/010303.

\* cited by examiner

PLASMA PROCESSING APPARATUS

TECHNICAL FIELD

The present invention relates to a plasma processing apparatus.

BACKGROUND ART

In the related art, in a manufacturing process of semiconductor devices, an etching technique using hydrogen fluoride (HF) has been known. Because of this, various plasma processing apparatuses for using hydrogen fluoride are devised.

For example, Japanese Patent Application Laid-Open No. 2016-025195 (Patent Document 1) discloses the following: a processed substrate is placed inside a chamber, the processed substrate including a first silicon oxide film formed on a surface of the processed substrate by chemical vapor deposition or atomic layer deposition, and further a second silicon oxide film made of a thermal oxide film and a silicon nitride film both adjacent to the first silicon oxide film; and HF gas and alcohol gas or steam are supplied into the chamber, so that the first silicon oxide film is selectively etched with respect to the second silicon oxide film and the silicon nitride film.

Further, Japanese Patent Application Laid-Open No. 2004-264881 (Patent Document 2) discloses the following: in a flow-rate control method for controlling the flow rate of hydrogen fluoride gas by use of a compression flow controller, a flow rate Q of gas flowing through an orifice is circulated as Q=KP1 (K is a constant) in a state where a ratio P2/P1 of a pressure P2 of gas on the downstream side from the orifice to a pressure P1 of gas on the upstream side from the orifice is maintained to be equal to or less than the critical pressure ratio of gas; and hydrogen fluoride gas is circulated through the orifice while the compression flow controller is heated to a temperature of 40° C. or more.

Citation List

Patent Documents

Patent Document 1: Japanese Patent Application Laid-Open No. 2016-025195
Patent Document 2: Japanese Patent Application Laid-Open No. 2004-264881

SUMMARY OF THE INVENTION

Problem to be Solved by the Invention

However, in the related art, in terms of gas such as hydrogen fluoride (HF), such a characteristic that the state of molecular association in which molecules attract each other varies depending on temperature or pressure is not considered. For example, gas such as hydrogen fluoride is clustered inside a supply passage at a normal temperature or less, and therefore, it is not assumed that an apparent flow rate changes due to clustering of molecules. Accordingly, output display of the flow rate of gas from a massflow controller (MFC) does not become equal to the amount of gas actually flowing out, and this might prevent an accurate flow control and affect a wafer process.

In view of this, an object of the present invention is to provide a plasma processing apparatus which can restrain clustering of gas and can stably supply gas.

Means for Solving the Problems

In order to achieve the object, one plasma processing apparatus is a plasma processing apparatus including an integrated gas box configured to adjust the flow rate of gas, and a discharge portion, and the integrated gas box includes gas blocks including a flow path through which the gas flows, a heater configured to heat the flow path, a bypass path provided in the flow path, and a flow controller configured to detect the inflow amount of the gas and output the gas from the flow path to the discharge portion.

Advantageous Effect of the Invention

With the present invention, it is possible to inhibit clustering of gas and to supply gas stably.

Objects, configurations, and effects other than those described above will be made clear by the description in Modes for carrying out the Invention as below.

MODES FOR CARRYING OUT THE INVENTION

The following describes an embodiment of the present invention with reference to the drawings. Note that the present invention is not limited by the embodiment. Further, in the description of the drawings, the same element has the same reference sign.

In this disclosure, in order to show a direction, directions indicated by an x-axis, a y-axis, and a z-axis described on the drawings may be used. Further, a "z-axis positive direction" may be referred to as an "upper side," and a "z-axis negative direction" may be referred to as a "lower side."

First Embodiment

With reference to FIGS. 1 to 4D, the following describes a first embodiment of the present invention.

<Plasma Processing Apparatus>

Figure 1:
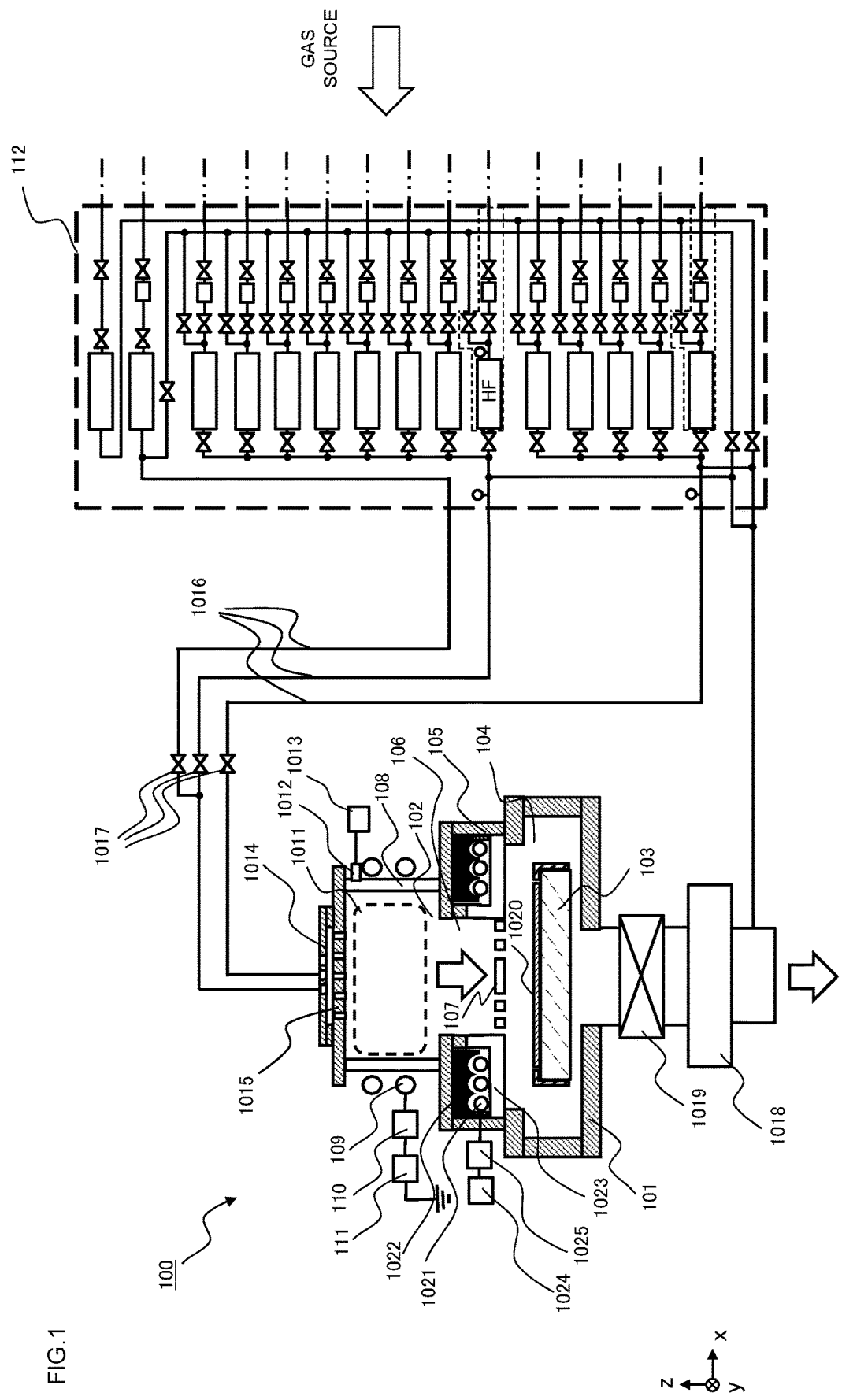
FIG. 1 is a view schematically illustrating a configuration of a plasma processing apparatus according to a first embodiment.

With reference to FIG. 1, a configuration of a plasma processing apparatus will be described.

FIG. 1 is a view schematically illustrating a configuration of the plasma processing apparatus according to the first embodiment. The first embodiment deals with a dry etching apparatus as a type of the plasma processing apparatus.

The dry etching apparatus includes, inside a vacuum chamber, a process chamber in which a wafer is placed, a discharge portion placed above the process chamber, the discharge portion being a portion inside which plasma is formed, and a lamp placed above the process chamber (in the z-axis positive direction) to surround a passage via which the process chamber and the discharge portion communicate with each other and through which particles of gas or plasma pass.

Such a dry etching apparatus first performs a step (adsorption step) of forming a layer of reaction products by supplying particles having reactivity and formed inside the discharge portion to a film of a process target on an upper surface of the wafer inside the process chamber and causing the film of the process target to adsorb the particles such that the film reacts with the particles. Subsequently, the dry etching apparatus performs a step (desorption step) of removing the layer of the reaction products by desorption or vaporization from the surface of the wafer by setting an appropriate temperature by heating the wafer. Hereby, isotropic etching can be performed on the film of the process target.

A plasma processing apparatus 100 illustrated in FIG. 1 roughly includes a vacuum chamber 101, a plasma forming unit (an ICP coil 109, a matching device 110, a high frequency source 111) placed around the outer periphery of the vacuum chamber 101 and configured to generate an electric field inside the vacuum chamber 101 and form plasma, and a gas discharge unit (a vacuum pump 1018, a gas discharge amount adjustment valve 1019) placed below the vacuum chamber 101 (in the z-axis negative direction) and configured to decrease the pressure inside the vacuum chamber 101 by discharging gas from the vacuum chamber 101.

The vacuum chamber 101 includes a discharge portion 102, a process chamber 104, an IR lamp unit 105, a passage 106, and a dispersion plate 107. The discharge portion 102 is a space inside a side wall placed in an upper part of the vacuum chamber 101 and having a cylindrical shape, and plasma 1011 is formed inside the discharge portion 102. The process chamber 104 is a space constituting a lower part of the vacuum chamber 101 and having a cylindrical shape, and a specimen support 103 having an upper surface on which the wafer is placed is provided in the space. Further, the IR lamp unit 105 applies, from above, infrared to the wafer placed on the specimen support 103 and heats the wafer. Further, the passage 106 is a cylindrical passage connecting the discharge portion 102 with the process chamber 104. Furthermore, the dispersion plate 107 is constituted by a disk-shaped dielectric placed inside the passage 106 and having a plurality of through-holes through which particles (active species) having activity such as radicals, generated in the plasma 1011, pass toward the process chamber 104.

Note that the central axes, in the up-down direction, of the passage 106 and the dispersion plate 107 are placed at a position close to the center of the circular upper surface of the specimen support 103 to such an extent that the central axes accord with or can be considered to accord with the center of the circular upper surface of the specimen support 103, and the dispersion plate 107 is placed in a lower end part of the passage 106 and is also placed above the specimen support 103, at a position where the dispersion plate 107 faces the specimen support 103.

The process chamber 104 and the discharge portion 102 of the plasma processing apparatus 100 are spaces having a cylindrical shape, and the central axes thereof are placed at a position close to that of the passage 106 to such an extent that the central axes are placed on or considered to be placed on the same axis as the passage 106. The process chamber 104 and the discharge portion 102 are divided by the dispersion plate 107 having a circular shape, and spaces above and below the dispersion plate 107 communicate with each other via the plurality of through-holes concentrically placed in the dispersion plate 107.

The space of the discharge portion 102 is placed inside a quartz container 108 having a cylindrical shape, the quartz container 108 being a container made of quartz or the like such that the quartz container 108 communicates with the process chamber 104 and the pressure inside the quartz container 108 is kept at a pressure with a predetermined degree of vacuum, the quartz container 108 being made of a material through which light from the plasma 1011 is permeable. The ICP coil 109 is placed outside the quartz container 108 to surround the side wall of the quartz container 108. The ICP coil 109 is electrically connected to the high frequency source 111 via the matching device 110. The ICP coil 109 generates a high-frequency field or an electric field by high-frequency power supplied from the high frequency source 111 and forms the plasma 1011 inside the discharge portion 102.

A top plate 1014 having a circular shape is placed above the discharge portion 102. A shower plate 1015 is placed below the top plate 1014 via a gap such that the shower plate 1015 is connected to the top plate 1014. Process gas is supplied from at least one gas supply pipe 1016 connected to the top plate 1014 and is introduced into the discharge portion 102 from its upper side through a plurality of through-holes placed in a central part of the shower plate 1015 via the gap between the top plate 1014 and the shower plate 1015.

Atoms or molecules of the process gas are excited by the electric field or the magnetic field generated by the ICP coil 109 such that the atoms or molecules are ionized or dissociated, and the plasma 1011 by an ICP discharge system is generated in the discharge portion 102. Power having a frequency band of several dozen megahertz is used as the high-frequency power supplied to the ICP coil 109 of the first embodiment, and the frequency of the high-frequency power is 13.56 MHz, for example.

In the first embodiment, the plasma 1011 is formed such that its state is observable by an optical technique. The light emission of the plasma 1011 generated in the discharge portion 102 is detected by use of an optical detector such as an OES (Optical Emission Spectroscopy) attached to the discharge portion 102. In the first embodiment, a spectroscope 1012 having a photoreceptor plane facing the inside of the discharge portion 102 is attached to an upper part of an outer peripheral side wall of the quartz container 108 surrounding the discharge portion 102, and light emitted from the generated plasma 1011 is from inside the quartz container 108 received through the photoreceptor plane on the discharge portion 102 side of the spectroscope 1012.

The spectroscope 1012 divides the received light emitted from the plasma 1011 into light at each of a plurality of wavelengths within a predetermined range, so that the intensity of light at each wavelength is detected. The spectroscope 1012 is connected to a controller 1013 of the plasma processing apparatus 100 such that the spectroscope 1012 is communicable with the controller 1013 in a wired or wireless manner, and the output from the spectroscope 1012 is transmitted to the controller 1013. The controller 1013 can calculate the intensity of emitted light at each wavelength from a received signal based on algorithm of software provided in advance and detect the state of the plasma 1011 inside the discharge portion 102 or the state of an inner wall surface of the quartz container 108 of the discharge portion 102 based on the value of the intensity or a result obtained by comparing the magnitude of a change in the intensity with a reference value.

Further, a sealing member such as an O-ring is placed between a lower surface of an outer peripheral edge part of the top plate 1014 having a circular shape and an upper surface of an upper end part of the quartz container 108 having a cylindrical shape and surrounding the discharge portion 102. As gas inside the discharge portion 102 and the process chamber 104 is discharged by the operation of the gas discharge unit such that the discharge portion 102 and the process chamber 104 are depressurized, the sealing member deforms by being sandwiched between the discharge portion 102 and the process chamber 104, and hereby, the sealing member airtightly seals between inside and outside the discharge portion 102. Thus, the quartz container 108 surrounding the discharge portion 102 and the top plate 1014 constitute the vacuum chamber 101.

The process gas is supplied through pipes connected to the vacuum chamber 101, the pipes extending from gas sources of respective gas types, placed below the floor face of a building where the plasma processing apparatus 100 is provided, for example. Further, an integrated gas box 112 having a box shape is placed on the pipes, the integrated gas box 112 including, in its inside, a plurality of ducts separated for a plurality of gas types and massflow controllers placed on the ducts and configured to adjust respective flow rates or speeds of gases of respective types. Inside the integrated gas box 112, the ducts configured to supply respective process gases are joined to each other and gathered up in a plurality of gas supply pipes 1016, and the plurality of gas supply pipes 1016 is extended outside the integrated gas box 112. The flow of gas to be introduced into the discharge portion 102 is adjusted by opening or closing opening-closing valves 1017 placed on the gas supply pipes 1016. In the first embodiment, as the process gas, combustible gas, supporting gas, mixed gas thereof, or mixed gas thereof that is diluted by an inert gas is used.

Below the process chamber 104, the vacuum pump 1018 such as a turbomolecular pump configured to discharge gas inside the process chamber 104 and depressurize the process chamber 104 is placed and connected thereto. The vacuum pump 1018 is connected to the vacuum chamber 101 constituting a bottom surface of the process chamber 104, via the gas discharge amount adjustment valve 1019 configured to adjust the flow rate or the speed of gas to be discharged by increasing or decreasing the area of a flow path of the gas.

Note that, inside the process chamber 104, the specimen support 103 having a mounting surface for a wafer 1020 is provided, the specimen support 103 having a central axis placed at a position close to the central axes, in the up-down direction, of the discharge portion 102 having a cylindrical shape, the process chamber 104, and the passage 106 via which the discharge portion 102 and the process chamber 104 communicate with each other, to such an extent that the central axis of the specimen support 103 accords with or can be considered to accord with the central axes of the discharge portion 102, the process chamber 104, and the passage 106. Further, the specimen support 103 having a cylindrical shape includes, in its inside, a substrate having a cylindrical shape and made of a conductive member such as metal, and inside the substrate, a refrigerant passage (not illustrated) through which refrigerant for adjusting the temperature of the wafer 1020 on the specimen support 103 is circulated is placed.

Above the process chamber 104, the IR lamp unit 105 placed into a ring shape around the outer periphery of the passage 106 is placed. The IR lamp unit 105 includes a triple IR lamp 1021 placed in the form of rings placed at three different positions in the radial direction to be directed outwardly from the central axis of the process chamber 104 or the passage 106 having a cylindrical shape, and a reflector 1022 placed above the IR lamp 1021 in the form of a ring and configured to reflect IR light as electromagnetic waves emitted from the IR lamp 1021 toward the process chamber 104 placed below or the mounting surface of the specimen support 103 and the wafer 1020 put on the mounting surface. Furthermore, the IR lamp unit 105 includes an IR light transmission window 1023 placed below the IR lamp 1021 to cover the upper side of the process chamber 104, constituting a cylindrical inner peripheral side wall of the passage 106, and made of a material such as quartz through which the IR light is permeable.

As the IR lamp 1021 of the first embodiment, three lamps having a circular shape and placed concentrically from their central axes such that the three lamps are placed at three different positions in the radial direction are used. Note that, as the electromagnetic wave emitted from each lamp of the IR lamp 1021, light (here, referred to as IR light) mainly including light in a range from visible light to infrared light is used. Note that the IR lamp 1021 is connected to a lamp power supply 1024 configured to supply electric power, and a high-frequency cut filter 1025 is placed between the IR lamp 1021 and the lamp power supply 1024 so that noise in the high-frequency power supplied to the ICP coil 109 does not reach the lamp power supply 1024 through the IR lamp.

Each of the three lamps in the IR lamp 1021, placed concentrically at respective radius positions from the central axis position, in the up-down direction, of the process chamber 104 and the passage 106, receives, from the lamp power supply 1024, supply of electric power the magnitude of which is individually adjusted, so that the intensity or amount of IR light to be emitted from the each of the three lamps is adjusted independently. The lamp power supply 1024 is communicably connected to the controller 1013 configured to adjust the operation of the plasma processing apparatus 100, and when the lamp power supply 1024 receives a command signal from the controller 1013, the lamp power supply 1024 adjusts, based on the command signal, the operation of the each of the three lamps in the IR lamp 1021 or the amount or intensity of the IR light to be emitted. In the first embodiment, the operations of the three lamps in the IR lamp 1021, placed concentrically around the central axis, are adjustable independently, and therefore, in a case where the wafer 1020 is heated by emission of IR light, the temperature distribution of the wafer 1020 in the radial direction can be adjusted to a desired distribution, thereby making is possible to reduce variations in the temperature distribution in the circumferential direction and make the temperature distribution more uniform.

Above the IR lamp 1021, the reflector 1022 is placed to reflect IR light to be output radially toward the lower side (a direction toward the specimen support 103 or the wafer 1020). Further, a ring-shaped ceiling surface of the process chamber 104 below the IR lamp 1021 and an inner-peripheral-side wall surface of the passage 106 continuous with the ceiling surface are constituted by an inner surface of the IR light transmission window 1023 made of quartz through which IR light is passed. Hereby, the IR light transmission window 1023 is placed such that a part where IR light emitted from the three lamps in the IR lamp 1021 toward the inside of the process chamber 104 and the surface of the wafer 1020 on the specimen support 103 is blocked becomes small or is eliminated. Particularly, a lower part of the inner-peripheral-side wall surface of the passage 106 and an inner peripheral edge of the ring-shaped ceiling surface part of the process chamber 104 are also constituted by members made of quartz and having a light-transmitting property, similarly to the IR light transmission window 1023, and the IR light emitted from the IR lamp 1021 toward the direction of the center of the process chamber 104 or the passage 106 evenly arrives at the wafer 1020, so that the wafer 1020 is heated efficiently.

An inner peripheral part of the IR lamp unit 105 placed in a ring shape has a cylindrical shape with the central axis along the up-down direction and constitutes part of the passage 106. Particles in the plasma 1011 formed inside the discharge portion 102 placed above the passage 106 passes through the passage 106 and flows toward the process chamber 104 below the passage 106. In a bottom portion inside the passage 106, the dispersion plate 107 made of dielectric such as quartz and having a disk shape with a diameter slightly smaller than the diameter of the passage 106 is placed. The dispersion plate 107 is placed above a central part of the mounting surface of the specimen support 103 or the upper surface of the wafer 1020 placed on the mounting surface such that the dispersion plate 107 faces the central part. A plurality of through-holes is placed in a central part of the dispersion plate 107, and while the through-holes block ions, electrons, or the like generated in the plasma 1011, the through-holes allow neutral particles or radicals to pass through the dispersion plate 107 so that the neutral particles or radicals are introduced into the process chamber 104.

<Integrated Gas Box and Gas Block>

Figure 2B:
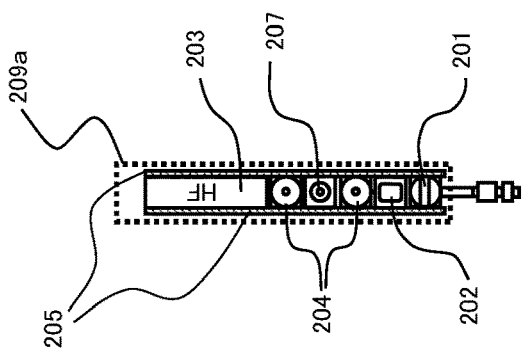
FIGS. 2A and 2B are views schematically illustrating an integrated gas box of the plasma processing apparatus according to the first embodiment.
Figure 2A:
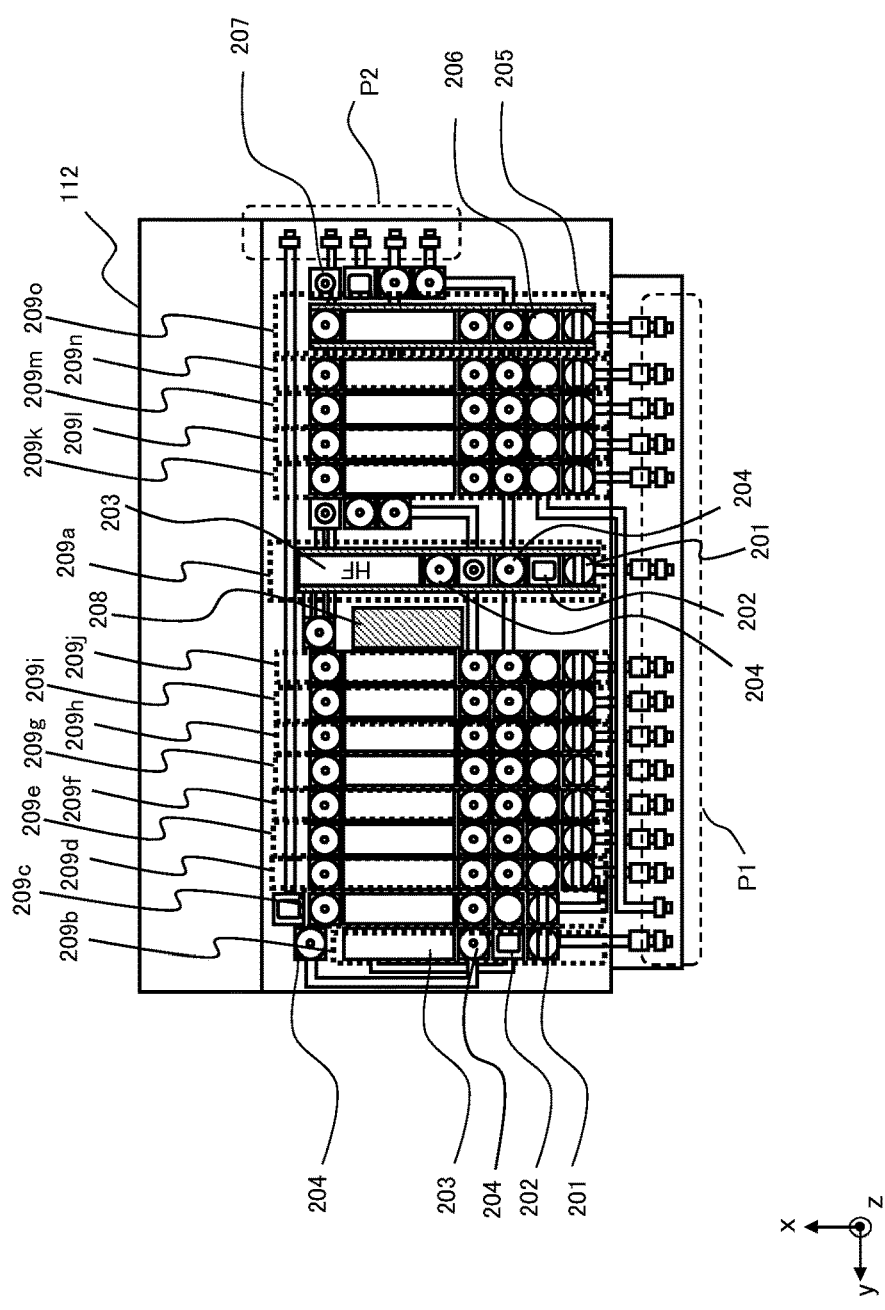

With reference to FIGS. 2A and 2B, the following describes the integrated gas box.

FIGS. 2A and 2B are views schematically illustrating the integrated gas box 112 of the plasma processing apparatus 100 according to the first embodiment. FIG. 2A is a view illustrating the whole integrated gas box 112. The integrated gas box 112 is constituted by integrating various gas blocks 209. FIG. 2B is a view in which a gas block 209a for HF gas is extracted from among the gas blocks 209 included in the integrated gas box. In FIG. 2A, respective process gases from gas sources such as gas cylinders are supplied to a plurality of gas pipes P1, and a plurality of gas pipe P2 is gathered up in the gas supply pipes 1016 illustrated in FIG. 1.

The gas block 209 forms a flow path through which gas flows, and in general, the gas block 209 is configured such that constituents of a hand valve 201, a pressure regulator 206, an air operated valve 204, and a massflow controller 203 (hereinafter also referred to as a "flow controller") are put together with a gas pipe. Here, the hand valve 201 is a manually operated valve and controls closing or opening of the gas flow path. The pressure regulator 206 adjusts the pressure of gas flowing through the flow path by adjusting a valve opening degree, for example. The air operated valve 204 is operated by air pressure and controls closing or opening of the gas flow path. The massflow controller 203 detects the inflow amount of the gas flowing through the flow path, adjusts the flow rate of the gas, and then outputs the gas.

A gas block 209a will be described later. A gas block 209b includes, as constituents, the hand valve 201, a bypass block 202, the air operated valve 204, and the massflow controller 203. A gas block 209c includes, as constituents, the hand valve 201, the pressure regulator 206, the air operated valve 204, and the massflow controller 203.

A gas block 209d includes, as constituents, the hand valve 201, the pressure regulator 206, two air operated valves 204, and the massflow controller 203. Gas blocks 209e to 209o have the same configuration as the gas block 209d except for gas.

The control substrate 208 controls the massflow controller 203 for HF gas. In the first embodiment, as will be described later, the gas block 209a is heated to a high temperature, and therefore, the control substrate 208 is provided at a position distanced from a main part of the massflow controller 203 so as to avoid failure.

The gas blocks 209a to 209o extend in the z-axis direction via gaps therebetween in the y-axis direction. The constituents of the gas block have a plurality of openings via which gas flowing inside flows in and out. As illustrated in FIGS. 4A-4D (described later), the openings of the constituents are connected via base blocks.

The flow paths extending from the gas blocks are gathered in the gas pipes P2, and the gas pipes P2 constitute the gas supply pipes 1016 extending from the integrated gas box 112. The gas supply pipes 1016 may be finally gathered into one and connected to the top plate 1014 such that the gas supply pipes 1016 are introduced into the central part of the gap between the top plate 1014 and the shower plate 1015, or the gas supply pipes 1016 may be connected to respective positions corresponding to a central part inside the quartz container 108 and an outer peripheral part of the quartz container 108 such that the gas supply pipes 1016 are introduced into a central part and an outer peripheral part inside the gap. The gas supply pipes 1016 are each configured to receive process gas the flow rate of which is adjusted by its corresponding massflow controller 203, and the process gas constituted by gas made of at least one type of substance is introduced into the discharge portion 102 at a flow rate or speed suitable for the process.

Next will be described details of the gas block 209a. In the first embodiment, as illustrated in FIG. 2A and FIG. 2B, the gas block 209a of the integrated gas box 112, constituting a gas flow path through which hydrogen fluoride (HF) gas flows, constitutes a flow path for the HF gas such that the constituents are connected to base blocks in order of the hand valve 201, the bypass block 202, the air operated valve 204, a pressure gauge 207, the air operated valve 204, and the massflow controller 203 from the upstream side. Further, a heater 205 is provided for the flow path. The gas block 209a is different from gas blocks for the other gases in the arrangement of the constituents and in that the bypass block 202 and the heaters 205 are provided.

<Heater>

The gas block 209a is provided with the heaters 205. In the first embodiment, the heaters 205 have a sheet shape, and the heaters 205 (e.g., rubber heaters) having elasticity and formed in a film or sheet shape are provided on both side surfaces of the base blocks and the constituents attached to the upper side of the base block. As the mounting form of the heater 205, the whole side surface of the gas block 209a may be covered with the heater 205 in a single-sheet shape, or the heater 205 may be divided into parts for predetermined constituents. Further, the heater 205 may be provided only on one side surface, or the heaters 205 may be provided in different forms for one side surface and the other side surface.

In the first embodiment, the temperature of the heater 205 is set to 90° C.±5° C., but the preset temperature is not limited to this. It is desirable that the temperature be equal to or more than 65° C., and it is further desirable that the temperature be equal to or more than 90° C.

The heater 205 can be provided for a gas block of process gas using steam evaporated from a liquid material, other than the HF gas, and in such a case, the gas block and its constituents are heated by the heater 205 to a predetermined temperature and kept warm based on the type of the gas.

The flow path for the HF gas in the gas block 209a is placed to have a relatively large gap from a gas flow path in a gas block adjacent to the gas block 209a. The magnitude of this gap is set to be larger than a gap between gas flow paths other than the flow path for the HF gas, and hereby, heating by the heater 205 is restrained from having an influence on the gases other than the HF gas. Since the heater 205 is also provided in the gas block 209o for the $CH_3OH$ gas, a relatively large gap is also set between the gas block 209c and the other gas flow paths.

<Gas Flow Path in Gas Block>

Figure 3:
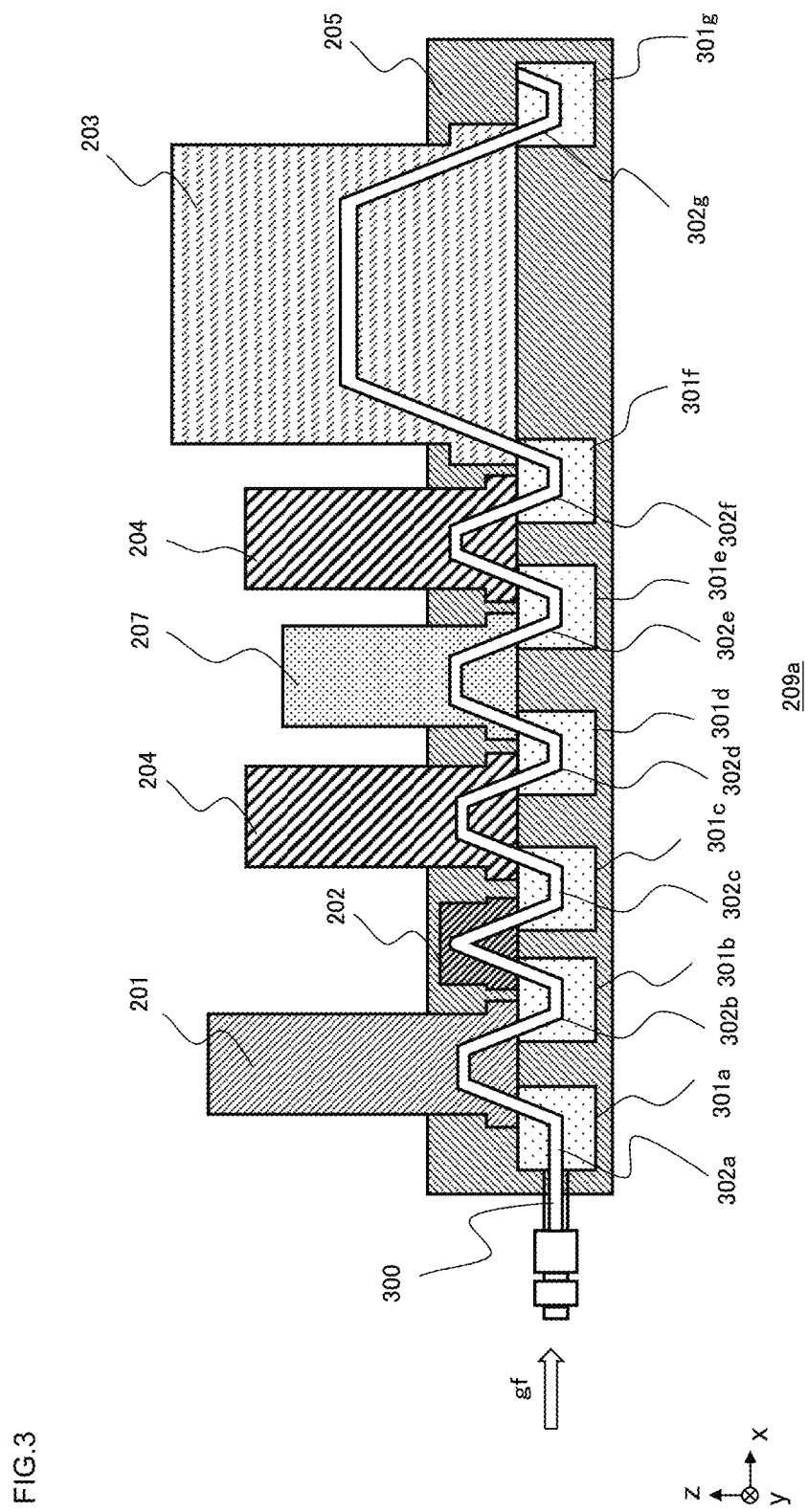
FIG. 3 is a view schematically illustrating a gas block for hydrogen fluoride.

With reference to FIG. 3, the following describes a gas flow path 300 in the gas block 209a for the HF gas.

FIG. 3 is a view schematically illustrating a gas block of hydrogen fluoride. The HF gas flows in from an arrow gf and flows out from the gas block 209a through the flow path 300.

As illustrated in FIG. 3, the gas block 209a for the HF gas is configured such that the constituents are arranged in order of the hand valve 201, the bypass block 202, the air operated valve 204, the pressure gauge 207, the air operated valve 204, and the massflow controller 203 from the upstream side, and the constituents are attached to base blocks 301a to 301g. The base blocks 301a to 301g have respective through-holes 302a to 302g connecting the constituents in the gas block 209a to each other. The flow path 300 inside the constituents of the gas block 209a is connected via through-holes 302 of the base block 301. Note that the base block 301 illustrated in FIG. 3 has a rectangular-solid shape or a similar shape that can be regarded as a rectangular-solid shape, but the shape of the base block 301 is not limited to this shape.

Further, the heaters 205 are attached to the gas block 209a for the HF gas from the base block 301a at one end part of the gas block 209a to the base block 301g at the other end part thereof to surround the flow path 300. The whole flow path 300 of the gas block 209a is heated to a predetermined temperature and kept warm by the heaters 205.

<Bypass Block>

The bypass block 202 is connected to the hand valve 201 via the base block 301b and is connected to the air operated valve 204 via the base block 301c. Gas flowing from the hand valve 201 reaches the air operated valve 204 through the base block 301b, the bypass block 202, and the base block 301c.

Note that the arrangement of the bypass block 202 is not limited to the arrangement illustrated in FIG. 3. The bypass block 202 should be placed on the upstream side from the massflow controller 203. However, it is desirable that the order of the hand valve, the air operated valve, the pressure gauge, the air operated valve, and the massflow controller from the upstream side be not changed. The following arrangements (1) to (3) viewed from the upstream side are conceivable, for example.

(1) the hand valve, the bypass block, the air operated valve, the pressure gauge, the air operated valve, and the massflow controller (the same arrangement as the arrangement illustrated in FIG. 3)

(2) the hand valve, the air operated valve, the bypass block, the pressure gauge, the air operated valve, and the massflow controller (3) the bypass block, the hand valve, the air operated valve, the pressure gauge, the air operated valve, and the massflow controller With reference to FIGS. 4A-4D, the following describes a configuration of the bypass block.

Figure 4D:
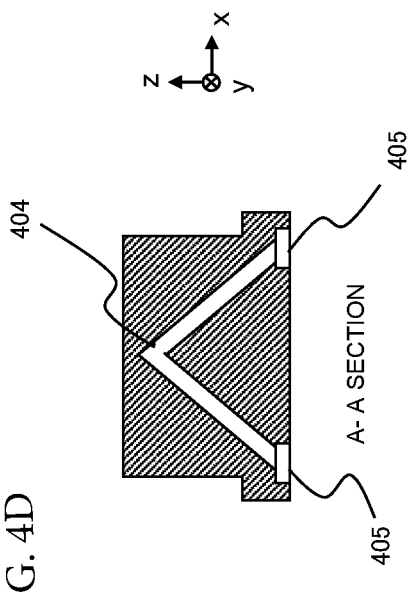
FIGS. 4A-4D are views schematically illustrating a configuration of a bypass block.
Figure 4A:
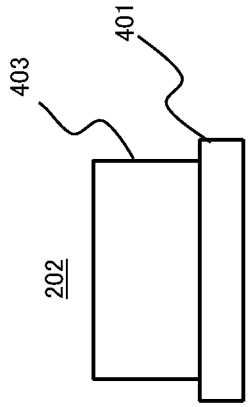
Figure 4B:
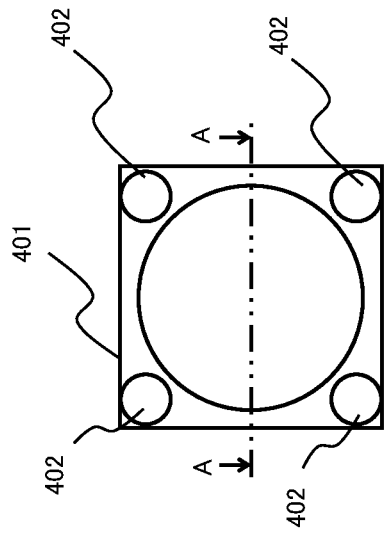
Figure 4C:
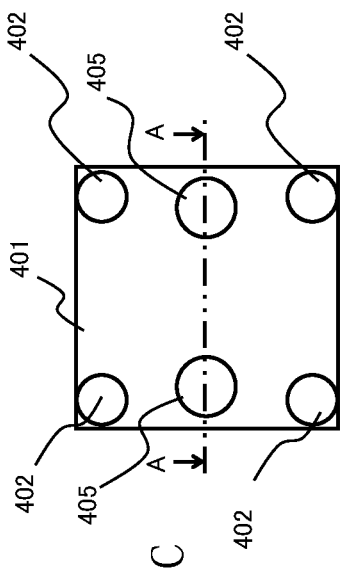

FIGS. 4A-4D are views schematically illustrating the configuration of the bypass block 202. FIG. 4A is a front view viewed from a y-axis negative direction and illustrates a case where the bypass block 202 is viewed from the same direction as in FIG. 3. FIG. 4B is a plan view viewed from the z-axis positive direction and illustrates a case where the bypass block 202 is viewed from the same direction as in FIGS. 2A and 2B. FIG. 4C is a bottom view viewed from the z-axis negative direction. FIG. 4D is a sectional view along a line A-A in FIG. 4B and illustrates an xz plane cut to half along the gas flow path.

The bypass block 202 includes a pedestal 401 having a rectangular shape or a shape resembling the rectangular shape when the pedestal 401 is viewed from the z-axis, and a cylindrical portion 403 placed above the pedestal 401 (in the z-axis positive direction). Fixation through-holes 402 into which bolts or screws are inserted at the time when the pedestal 401 is attached to the base block 301 are placed at four corners of the pedestal 401, on the outer peripheral side from the cylindrical portion 403, such that the fixation through-holes 402 penetrate through the pedestal 401 in the up-down direction.

As illustrated in FIG. 4D, a bypass path 404 penetrating through the inside of the pedestal 401 and the inside of the cylindrical portion 403 and configured such that gas flows therethrough is provided inside the bypass block 202, between one end part of a bottom surface of the bypass block 202 to the other end part thereof. Both ends of the bypass path 404 are connected to openings 405 placed on the bottom surface of the pedestal 401. That is, the bypass path 404 serves as a through-hole having these two openings 405 at the end parts of the bypass path 404 and penetrating through the bypass block 202.

The shape of the bypass path 404 has a shape curved or bent in a gas flow direction in general, and FIG. 4D illustrates an example of a projecting shape (a reverse V-shape) having a vertex on the top. However, the bypass path 404 is not limited to this, and although there are restrictions in workability or the dimension of the bypass block, the bypass path 404 can have a given shape, provided that the shape can cause turbulence components by causing changes in the pressure in the gas flowing inside the bypass path 404. From this viewpoint, it is desirable that the sectional shape of the bypass path 404 include a bending portion having an acute angle. Further, as the bypass path 404, a general pipe with an inside diameter of ¼ inch is used, but the size of the inside diameter is not limited to this.

Modification 1 of First Embodiment

Figure 5:
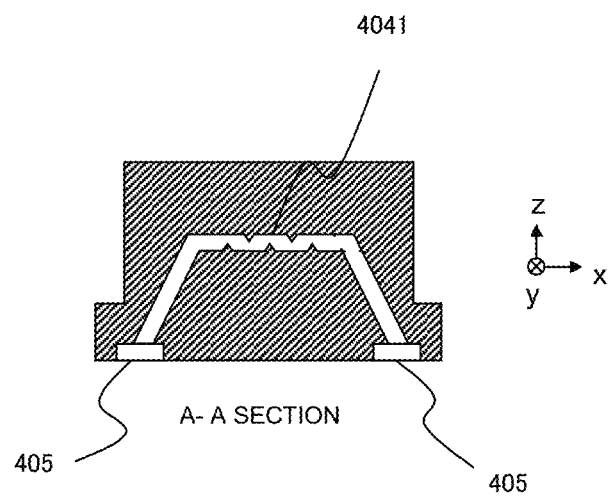
FIG. 5 is a sectional view of a bypass block according to Modification 1 of the first embodiment.

With reference to FIG. 5, the following describes Modification 1 of the first embodiment.

Modification 1 of the first embodiment is different from the first embodiment in that the bypass path of the bypass block has a different shape. In the following description, configurations other than the difference are the same as the configurations described in the first embodiment, and descriptions thereof are omitted unless otherwise required.

FIG. 5 is a sectional view of a bypass block 2021 according to Modification 1 of the first embodiment. FIG. 5 is a view corresponding to the sectional view illustrated in FIG. 4D.

A bypass path 4041 illustrated in FIG. 5 has a projecting shape in which a path inner surface along the x-axis, located in the middle, projects inwardly. A shape projecting at an acute angle is illustrated, but the shape is not limited to this. The shape, the number, and the position of the projecting shape can be selected in accordance with the type of gas flowing through the bypass path 4041 or the setting of the flow rate of the gas.

Modification 2 of First Embodiment

Figure 6:
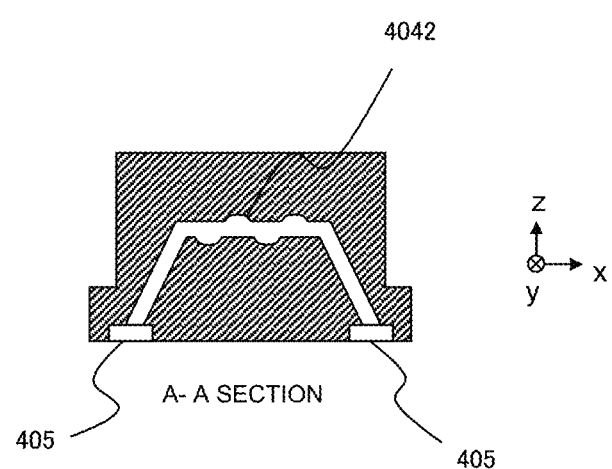
FIG. 6 is a sectional view of a bypass block according to Modification 2 of the first embodiment.

The following describes Modification 2 of the first embodiment with reference to FIG. 6.

Modification 2 of the first embodiment is different from the first embodiment and Modification 1 of the first embodiment in that the bypass path of the bypass block has a different shape. In the following description, configurations other than the difference are the same as the configurations described in the first embodiment, and descriptions thereof are omitted unless otherwise required.

FIG. 6 is a sectional view of a bypass block 2022 according to Modification 2 of the first embodiment. FIG. 6 is a view corresponding to the sectional view illustrated in FIG. 4D.

A bypass path 4042 illustrated in FIG. 6 has a recess formed such that a path inner surface along the x-axis, located in the middle, is recessed inwardly. The shape, the number, and the position of the recess can be selected in accordance with the type of gas flowing through the bypass path 4042 or the setting of the flow rate of the gas.

<Evaluation Result>

Referring now to FIGS. 7 to 9B, experimental results of the first embodiment will be described.

Figure 7:
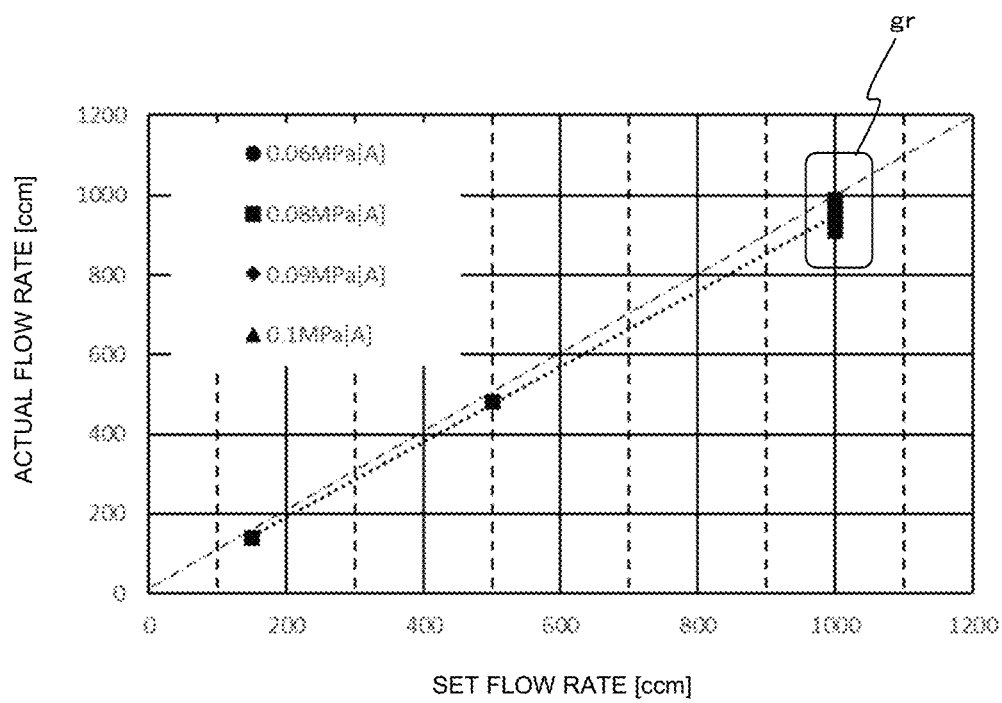
FIG. 7 is a view illustrating the relationship between the set flow rate and the actual flow rate when a massflow controller is at 90° C.

FIG. 7 is a view illustrating the relationship between the set flow rate and the actual flow rate when the massflow controller is at 90° C.

Here, the pressure of the HF gas to be supplied to the massflow controller was varied to 0.06 MPa(A), 0.08 MPa(A), 0.09 MPa(A), and 0.1 MPa(A). Further, the actual flow rate was measured from HF gas output from the massflow controller by a chromatograph. The massflow controller was heated to 90° C. and kept warm.

In FIG. 7, a straight line indicated by an alternate long and short dash line represents a locus in a case where the set values of the flow rate accord with the actual flow rate. Further, a straight line indicated by a dotted line is an approximate straight line based on values at a pressure of 0.08 MPa(A). At set flow rates of 150 ccm and 500 ccm, actual flow rates at a supply pressure of 0.08 MPa(A) are exhibited. At a set flow rate of 1000 ccm, when the measurement was performed such that the supply pressure was varied to 0.06 MPa(A), 0.08 MPa(A), 0.09 MPa(A), and 0.1 MPa(A), measured values had values closer to each other, and therefore, a range including the measured values is indicated by a region gr, for convenience.

Figure 8:
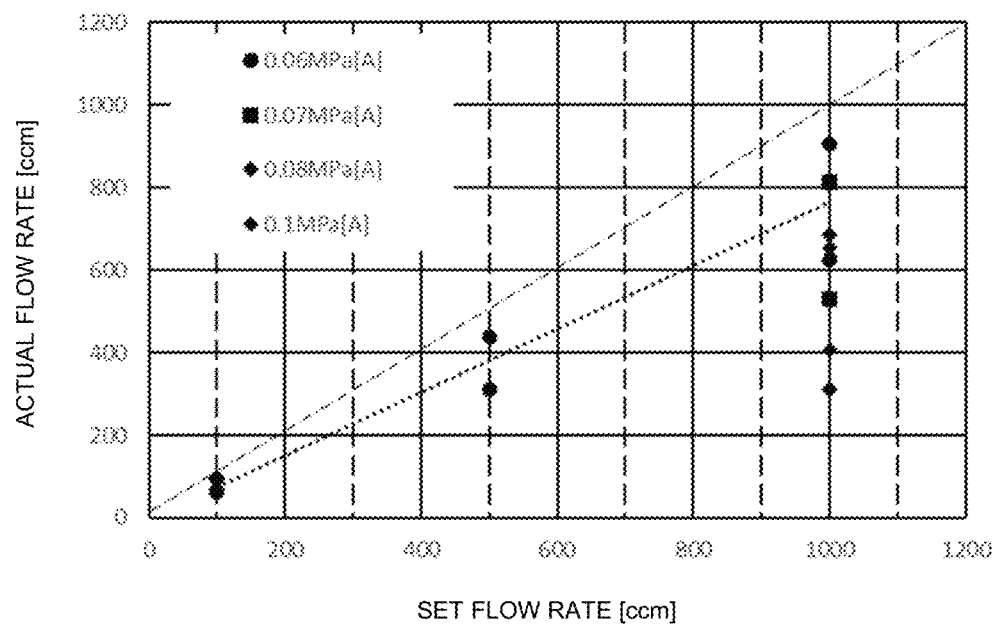
FIG. 8 is a view illustrating the relationship between the set flow rate and the actual flow rate when the massflow controller is at 40° C.

Next will be described experimental data as a comparative example. FIG. 8 is a view illustrating the relationship between the set flow rate and the actual flow rate when the massflow controller is at 40° C. Here, the pressure of the HF gas to be supplied to the massflow controller was varied to 0.06 MPa(A), 0.07 MPa(A), 0.08 MPa(A), and 0.1 MPa(A). The massflow controller was heated to 40° C. and kept warm. Other conditions are the same as the conditions of the experiment in FIG. 7. Similarly to FIG. 7, a straight line indicated by an alternate long and short dash line represents a locus in a case where the set values of the flow rate accord with the actual flow rate. Further, a straight line indicated by a dotted line is an approximate straight line based on values at a pressure of 0.06 MPa(A). At set flow rates of 100 ccm and 500 ccm, actual flow rates at a supply pressure of 0.08 MPa(A) are exhibited. At a set flow rate of 1000 ccm, values measured with the supply pressure being varied to 0.06 MPa(A), 0.07 MPa(A), 0.08 PMa(A), and 0.1 MPa(A) are exhibited.

When FIG. 7 is compared with FIG. 8, the deviation between the set flow rate and the actual flow rate is smaller in the case of 90° C. in FIG. 7 than the case of 40° C. in FIG. 8. This is presumably because, since the temperature of the flow path was heated to 90° C., clustering of the HF gas was inhibited, and the flow rate was adjusted in the massflow controller with the HF gas being maintained in a monomeric state.

Figure 9A:
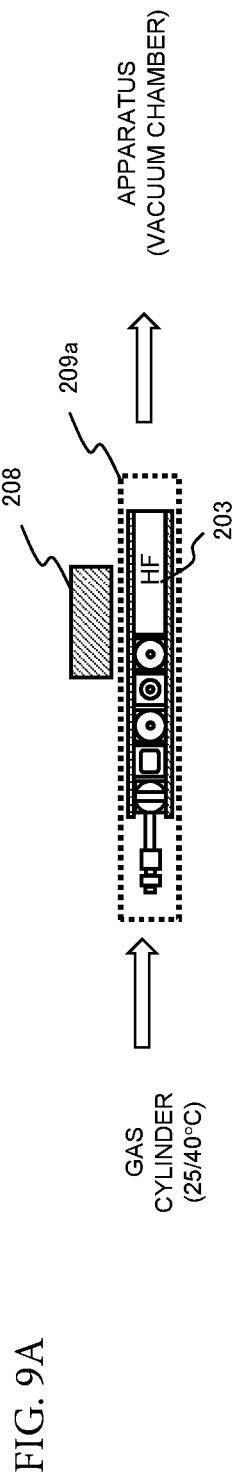
FIGS. 9A and 9B are views illustrating the relationship between the temperature setting on the upstream side from the gas block and the flow rate to be output.
Figure 9B:
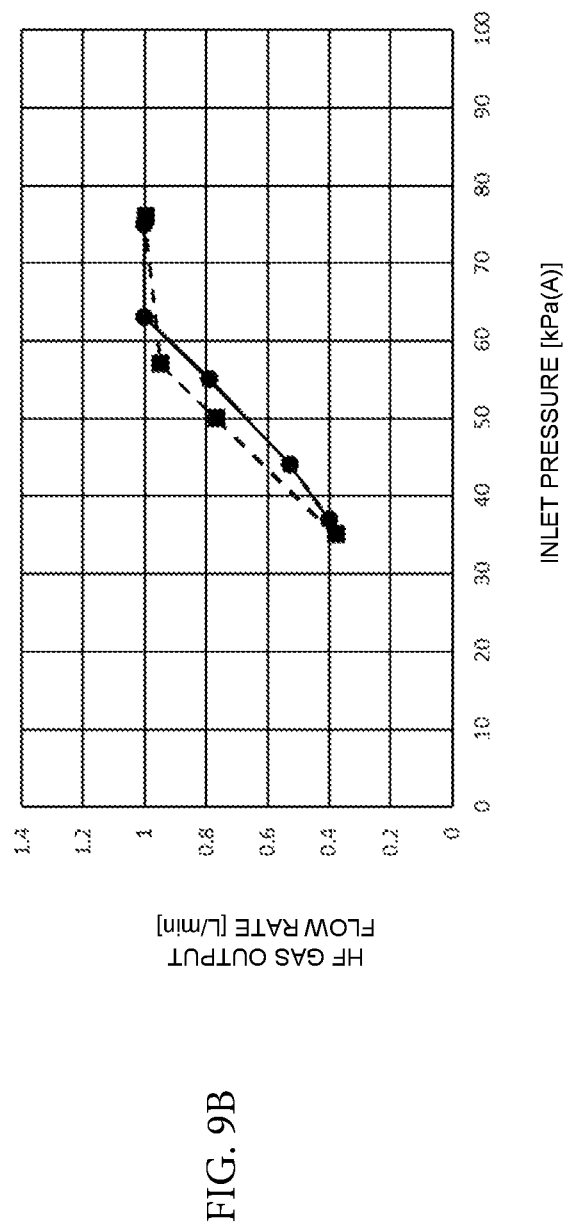

FIGS. 9A and 9B are views illustrating the relationship between the temperature setting on the upstream side from the gas block 209a and the flow rate to be output.

FIG. 9A is a view illustrating the outline of an experiment. The gas cylinder and the upper side from the massflow controller are heated to 25° C. or 40° C. and kept warm, gas is introduced, and the pressure of gas output from the gas block 209a is measured.

FIG. 9B illustrates the relationship between the pressure (inlet pressure) in an input portion of the massflow controller 203 and the flow rate of the HF gas output from the massflow controller 203. Here, the flow rate was acquired when the set value of the output flow rate of the massflow controller 203 was fixed to 1 L/min, and the inlet pressure was varied. A graph indicated by a continuous line represents a result when the temperatures in the gas cylinder and on the upstream side from the massflow controller 203 were set to 25° C. A graph indicated by a broken line represents a result when the temperatures in the gas cylinder and on the upstream side from the massflow controller 203 were set to 40° C.

From the consideration of the result, when the pressure of the input portion of the massflow controller 203 was 60 kPa(A) or more, a flow rate generally equivalent to the set value could be acquired under any temperature condition. Further, under any temperature condition, the flow rate did not largely vary. From this point, in the first embodiment, it is found that, in a case where the pressure in the input portion of the massflow controller 203 is 60 kPa(A) or more, stable output from the gas block 209a is achievable regardless of the state of the temperatures in the gas source and on the upstream side from the gas block.

<Operations and Effects>

Figure 10:
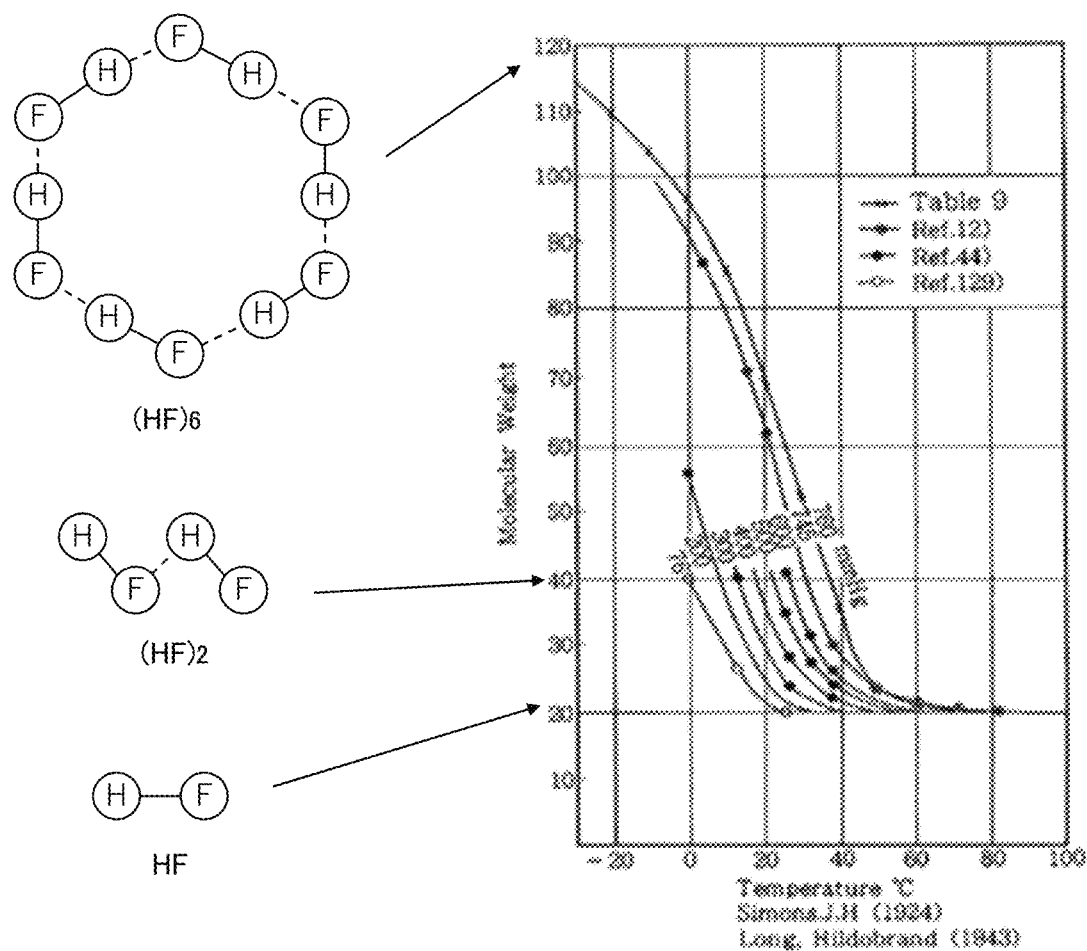
FIG. 10 is a view illustrating the relationship between the molecular weight of HF gas and the temperature.

Next will be described operations and effects of heating and warming by the heater 205. FIG. 10 is a view illustrating the relationship between the molecular weight of HF gas and the temperature. Results measured at a plurality of pressures are exhibited in FIG. 10. Here, a molecular weight 20 corresponds to a monomer HF, a molecular weight 40 corresponds to a dimer $(HF)_2$, and a molecular weight 120 corresponds to a hexamer $(HF)_6$.

As illustrated in FIG. 10, in a temperature region from a room temperature to 40° C., the HF gas can take a multimeric state as well as a monomeric state. A conventional etching process using HF gas is performed in a temperature region from the room temperature to around 40° C. Under a temperature environment in which such an etching process is performed, HF gas in a multimeric state may be included in the process gas used for etching, and this causes clustering.

Further, as illustrated in FIG. 10, from the relationship between the molecular weight and the temperature in a range near the atmospheric pressure (760 mmHg), it is found that the molecular weight increases and the HF gas tends to be easily clustered. In the conventional etching process using HF gas, in order to restrain HF gas to be supplied into a vacuum chamber from diffusing inside a building where a plasma processing apparatus is provided, the HF gas is supplied at a pressure lower than the pressure inside the building, that is, at a so-called negative pressure. Under such an environment of the pressure in the range near the atmospheric pressure, HF gas in a multimeric state may be included in the process gas used for etching, and this causes clustering.

In the first embodiment, by heating by the heater 205, the temperature of the HF gas becomes higher than a temperature at which the HF gas is easily clustered, thereby inhibiting clustering. As can be seen from FIG. 10, when the temperature is set to be equal to or more than 65° C., further desirably equal to or more than 90° C., the monomeric state can be maintained generally without depending on the pressure, thereby making it possible to inhibit clustering. Accordingly, since most part of the HF gas is in the monomeric state, it is possible to reduce a deviation of the flow rate of HF gas from its expected value or fluctuations in the value of the HF gas with time, the HF gas being introduced into the gas supply pipe 1016 from the gas block 209a.

Further, the whole gas block 209a for the HF gas is heated by the heater 205. Hereby, heat dissipation from the massflow controller 203 to its adjacent pressure gauge 207 or air operated valve 204, or the like is reduced, thereby restraining changes in the temperature in the massflow controller 203. Since the operating environment of the massflow controller 203 is stabilized, it is possible to stably demonstrate a flow-rate adjustment function.

Note that, in a case where it is necessary to adjust the temperature of the HF gas, the massflow controller 203 can be also functionalized as a buffer area where the HF gas is temporarily accumulated and heated.

Next will be described operations and effects of the bypass block 202. Inside the bypass block 202, the bypass path 404 has a curved or bent shape and hereby yields an operation to disturb the flow direction of the HF gas.

Hereby, while the resistance to be received by the flowing HF gas increases and the fall of the gas pressure in the flow direction increases, the flow of the HF gas contains turbulence components. Since thermal conduction or mixing of gas is promoted by the turbulence components, clustering of molecules in the gas is inhibited. When such HF gas is introduced into the massflow controller 203, the stability in adjustment of the flow rate by the massflow controller 203 improves. Further, the gas pressure in the flow direction is reduced, and therefore, even when an extra constituent such as the pressure regulator 206 is not placed on the upstream side from the massflow controller 203, the adjustment of the flow rate to be performed by the massflow controller 203 is stabilized.

Further, in terms of Modifications 1, 2 of the first embodiment, the bypass path 4041, 4042 gives a resistance to the HF gas flowing therethrough and largely decreases the gas pressure in the flow direction. Further, due to the presence of the bypass path 4041, 4042, the flow of the HF gas can contain turbulence components. Accordingly, similarly to the first embodiment, even in the case of Modifications 1, 2, it is possible to stabilize flow rate adjustment by the massflow controller 203 placed on the downstream side from the bypass block 2021, 2022.

The embodiment of the invention has been described above, but the invention is not limited to the above embodiment. For example, the embodiment deals with HF gas as the process gas, but the process gas is not limited to this. The present invention is also applicable to other gases having a feature of clustering. Thus, various modifications can be made within a range that does not beyond the gist of the present invention.

DESCRIPTION OF REFERENCE NUMERALS 100 plasma processing apparatus
101 vacuum chamber
102 discharge portion
103 specimen support
104 process chamber
105 IR lamp unit
106 passage
107 dispersion plate
108 quartz container
109 ICP coil
110 matching device
111 high frequency source
112 integrated gas box
1011 plasma
1012 spectroscope
1013 controller
1014 top plate
1015 shower plate
1016 gas supply pipe
1017 opening-closing valve
1018 vacuum pump
1019 gas discharge amount adjustment valve
1020 wafer
1021 IR lamp
1022 reflector
1023 IR light transmission window
1024 lamp power supply
1025 high-frequency cut filter
201 hand valve
202 bypass block
203 massflow controller
204 air operated valve
205 heater
206 pressure regulator
207 pressure gauge
208 control substrate
209a to 209o gas block
300 flow path
301a to 301g base block
302a to 302g through-hole
401 pedestal
402 fixation through-hole
403 cylindrical portion
404, 4041, 4042 bypass path
405 opening

The invention claimed is:

1. A plasma processing apparatus comprising:
   an integrated gas box configured to adjust a flow rate of gas, and
   a discharge portion, wherein:
   the integrated gas box includes gas blocks including
      a flow path through which the gas flows,
      a heater configured to heat the flow path,
      a bypass path provided in the flow path, and
      a flow controller configured to detect an inflow amount of the gas and output the gas from the flow path to the discharge portion.

2. The plasma processing apparatus according to claim 1, wherein:
   the heater is configured to perform heating to a predetermined temperature based on a type of the gas.

3. The plasma processing apparatus according to claim 2, wherein:
   the predetermined temperature is equal to or more than 65° C.

4. The plasma processing apparatus according to claim 3, wherein:
   the predetermined temperature is equal to or more than 90° C.

5. The plasma processing apparatus according to claim 1, wherein:
   the bypass path includes a flow path causing a change in a pressure of the gas flowing through the flow path.

6. The plasma processing apparatus according to claim 1, wherein:
   the bypass path includes a bending portion having a sectional shape having an acute angle.

7. The plasma processing apparatus according to claim 1, wherein:
   the bypass path has an inner surface having a projecting shape.

8. The plasma processing apparatus according to claim 1, wherein:
   the bypass path has an inner surface having a recess.

9. The plasma processing apparatus according to claim 1, wherein:
   the flow controller includes an input portion having a pressure of 60 kPa(A) or more.

10. The plasma processing apparatus according to claim 1, wherein:
    the gas includes hydrogen fluoride.

* * * * *